US007092421B2

(12) United States Patent
Capasso et al.

(10) Patent No.: US 7,092,421 B2
(45) Date of Patent: Aug. 15, 2006

(54) UNIPOLAR, INTRABAND OPTOELECTRONIC TRANSDUCERS WITH MICRO-CAVITY RESONATORS

(75) Inventors: Federico Capasso, Cambridge, MA (US); Alfred Yi Cho, Summit, NJ (US); Raffaele Colombelli, Paris (FR); Claire F. Gmachl, Princeton, NJ (US); Oskar Jon Painter, Sierra Madre, CA (US); Arthur Mike Sergent, New Providence, NJ (US); Deborah Lee Sivco, Warren, NJ (US); Kartik Srinivasan, Pasadena, CA (US); Donald Milan Tennant, Gillette, NJ (US); Mariano Troccoli, Cambridge, MA (US)

(73) Assignee: Lucent Technologies Inc., Murray Hill, NJ (US)

( * ) Notice: Subject to any disclaimer, the term of this patent is extended or adjusted under 35 U.S.C. 154(b) by 444 days.

(21) Appl. No.: 10/651,466

(22) Filed: Aug. 30, 2003

(65) Prior Publication Data

US 2005/0063438 A1    Mar. 24, 2005

(51) Int. Cl.
    *H01S 3/19*    (2006.01)
(52) U.S. Cl. .......................... 372/45; 372/96
(58) Field of Classification Search .................. 372/45
    See application file for complete search history.

(56) References Cited

U.S. PATENT DOCUMENTS

| | | | | |
|---|---|---|---|---|
| 5,509,025 A | * | 4/1996 | Capasso et al. ............... | 372/45 |
| 5,936,989 A | * | 8/1999 | Capasso et al. ............... | 372/45 |
| 5,953,356 A | * | 9/1999 | Botez et al. ................... | 372/45 |
| 6,169,756 B1 | | 1/2001 | Chirovsky et al. ............ | 372/46 |
| 6,278,134 B1 | * | 8/2001 | Capasso et al. ............... | 257/96 |
| 6,301,282 B1 | | 10/2001 | Capasso et al. ............... | 372/46 |
| 6,404,791 B1 | * | 6/2002 | Yang ............................ | 372/45 |
| 6,476,411 B1 | * | 11/2002 | Ohno et al. ................... | 257/15 |
| 6,500,688 B1 | * | 12/2002 | Bruno et al. .................. | 438/39 |
| 6,597,721 B1 | * | 7/2003 | Hutchinson et al. .......... | 372/98 |
| 6,819,696 B1 | * | 11/2004 | Belenky et al. ............... | 372/45 |

OTHER PUBLICATIONS

Capasso et al., *IEEE J. Quantum Electr.*, vol. 38, No. 6, p. 511 (2002).
Hofstetter et al., *Appl. Phys. Lett.*, vol. 75, No. 24, p. 3769 (1999).
Liu, "Quantum Well Infrared . . . ", Ch. 3, pp. 129-196, "Instersubband Transitions . . . ", Eds. Liu and Capasso, Series: *Semiconductors and Semimetals*, vol. 62, Academic Press, London, UK (2000) (no Copy Attached).

(Continued)

*Primary Examiner*—James Vannucci (57) ABSTRACT

An optoelectronic transducer comprises a unipolar, intraband active region and a micro-cavity resonator. The resonator includes a 2D array of essentially equally spaced regions that exhibits resonant modes. Each of the spaced regions has a depth that extends through the active region and has an average refractive index that is different from that of the active region. The refractive index contrast, the spacing of the spaced regions, and the dimensions of the spaced regions are mutually adapted so that the array acts as a micro-cavity resonator and so that at least one frequency of the resonant modes of the array falls within the spectrum of an optoelectronic parameter of the active region (i.e., the gain spectrum where the transducer is a laser; the absorption spectrum where the transducer is a photodetector). In a first embodiment, the transducer is an ISB laser, whereas in a second embodiment it is a unipolar, intraband photodetector. In other embodiments, the laser is a surface-emitting ISB laser and the photodetector is a vertically-illuminated detector. In another embodiment, a nonlinear optical material is optically coupled to the micro-cavity resonator, which in one case allows an ISB laser to exhibit bistable operation.

33 Claims, 7 Drawing Sheets

OTHER PUBLICATIONS

Gmachl et al., *Appl. Phys. Lett.*, vol. 72, No. 24, p. 3130 (1998).
Joannopoulos et al., *Nature*, vol. 386, p. 143 (1997).
Joannopoulos et al., *Photonic Crystals*, Princeton University Press (1995) (no Copy Attached).
Scherer et al., *Opt. Phot. News*, vol. 2, p. 9 (1991).
Painter et al., *Science*, vol. 284, p. 1819 (1999).
Imada et al., *Appl. Phys. Lett.*, vol. 75, No. 3, p. 316 (1999).
Park et al., *Appl. Phys. Lett.*, vol. 79, No. 19, p. 3032 (2001).
Notomi et al., *Appl. Phys. Lett.*, vol. 78, No. 10, p. 1325 (2001).
D'Urso et al., *J. Opt. Soc. of America—B*, vol. 15, No. 3, p. 1155 (1998).
Painter et al., *J. Opt. Soc. of America—B*, vol. 16, No. 2, p. 275 (1999).
Srinivasan et al., *Opt. Express*, vol. 10, No. 15, p. 670 (2002).
Sakoda, *J. Appl. Phys.*, vol. 84, No. 3, p. 1210 (1998).
Sirtori et al., *Opt. Lett.* vol. 23, No. 17, p. 1366 (1998).
Happ et al., *Appl. Phys. Lett.*, vol. 82, No. 1, p. 4 (2003).
Imada et al., *Phys. Rev. B*, vol. 65, p. 195306-1 (2002).
Tennant et al., "Fabrication Methods for a Surface Emitting Photonic Bandgap Quantum Cascade Laser", Abstract of Talk at $47^{th}$ *Int. Conf on EIPBN*, Tampa, FL (May 27-30, 2003).
Colombelli et al., "Quantum Cascade photonic crystal surface emitting injection laser", Abstract of Talk at *CLEO-QELS*, Baltimore, MD (Jun. 1-6, 2003).

\* cited by examiner

UNIPOLAR, INTRABAND OPTOELECTRONIC TRANSDUCERS WITH MICRO-CAVITY RESONATORS

GOVERNMENT CONTRACT

This invention was made with Government support under Contract No. DAAD19-00-C-0096 by the DARPA/US Army Research Office. The Government has certain rights in this invention.

BACKGROUND OF THE INVENTION

1. Field of the Invention

This invention relates to unipolar, intraband optoelectronic transducers in general and, more particularly, to intersubband (ISB) semiconductor lasers and intraband photodetectors that include micro-cavity resonators.

2. Discussion of the Related Art

Optoelectronic transducers convert optical energy to electrical energy (e.g., a photodetector) or they convert electrical energy to optical energy (e.g., a laser). When the active regions of these devices are made from semiconductor materials, they may be either bipolar (e.g., conventional interband photodiodes or laser diodes) or unipolar (e.g., conventional ISB lasers or intraband quantum well infrared photodetectors, known as QWIPs).

We focus here on unipolar optoelectronic transducers including illustratively both ISB semiconductor lasers and intraband photodetectors.

Within the span of a few years, ISB lasers in general, and quantum cascade (QC) lasers in particular, have established themselves as the leading tunable coherent semiconductor sources in the mid-infrared (mid-IR) and far-infrared (far-IR) range of the electromagnetic spectrum. [See, F. Capasso et al., *IEEE J. Quan. Elec.*, Vol. 38, p. 511 (2002), which is incorporated herein by reference.] Their uniqueness stems from the use of an intraband optical transition: the device is unipolar, and electrons, for example, undergo a quantum jump between quantized conduction band states, called subbands, of a suitably designed semiconductor multi-quantum-well structure. However, due to the naturally transverse magnetic (TM) polarization of the intersubband transitions, QC lasers are intrinsically only in-plane emitters, with the electric-field vector perpendicular to the plane of the semiconductor layers.

Typically, therefore, the cavity resonator of a QC laser has its axis in the plane of the active region. It is formed, for example, by a pair of parallel cleaved crystal facets that act as mirrors. In general, such resonators are relatively long (e.g., 1–3 mm) due to the low reflectivity of the facets.

Surface emission, on the other hand, cannot easily be achieved in QC lasers, although such a characteristic would be extremely desirable for several applications. By surface emission (or vertical emission) we mean emission whose principal direction is transverse to the layers of the device; that is, the optical output emerges through the top or bottom major surface of the device, rather than parallel to the layers of the device; that is, and through the side or edge surfaces of the device. Previous attempts to develop surface-emitting QC lasers have made use of second-order Bragg gratings superimposed on conventional edge-emitting QC lasers, but those designs did not address the large size of the devices. [See, for example, D. Hofstetter et al., *Appl. Phys. Lett.*, Vol. 75, p. 3769 (1999) and W. Schrenk et al., *Appl. Phys. Lett.*, Vol. 77, p. 2086 (2000), which are incorporated herein by reference.]

Thus, a need remains in the art for a surface-emitting ISB laser that is relatively small in size.

In contrast, surface-emitting interband lasers, which are inherently bipolar, are common in the art. One design, known as a VCSEL, includes an active region sandwiched between multilayer dielectric and/or semiconductor mirrors that form an optical cavity resonator. The principal optical output is directed normal to the layers and emerges through either mirror, depending on which one is made to be partially transmissive. [See, for example, L. M. Chirovsky et al., U.S. Pat. No. 6,169,756 issued on Jan. 2, 2001, which is incorporated herein by reference.]

The same principles of physics that render ISB lasers intrinsically in-plane emitters also dictate that these ISB structures would be inefficient detectors of vertical illumination; i.e., light that is incident on the device in a direction that is transverse to the layers of the device.

Similar limitations exist for QWIPs, which are unipolar, intraband devices in which optoelectronic transitions typically take place between a ground state and a continuum (rather than between subbands). See, H. C. Liu, "Quantum Well Infrared Photodetector Physics and Novel Devices", Ch. 3, pp. 129–196, in *Intersubband Transitions in Quantum Wells: Physics and Device Applications I*, Eds. H. C. Liu and F. Capasso; Series: Semiconductors and Semimetals, Vol. 62, Academic Press, London, UK (2000), which is incorporated herein by reference.

Thus, a need also remains in the art for a vertically-illuminated unipolar, intraband photodetector.

BRIEF SUMMARY OF THE INVENTION

In accordance with one aspect of our invention, an optoelectronic transducer comprises a unipolar, intraband active region and a micro-cavity resonator. The resonator includes a two-dimensional (2D) array of essentially equally spaced regions that exhibits resonant modes. Each of the spaced regions has a depth that extends through the active region and has an average refractive index that is different from that of the active region. The refractive index contrast, the spacing of the spaced regions, and the dimensions of the spaced regions are mutually adapted so that the array acts as a micro-cavity resonator and so that at least one frequency of the resonant modes of the array falls within the spectrum of an optoelectronic parameter of the active region (i.e., the gain spectrum when the transducer is a laser; the absorption spectrum when the transducer is a photodetector).

In a first embodiment, the transducer is an ISB laser, whereas in a second embodiment it is a unipolar, intraband photodetector.

In yet another embodiment, the refractive index contrast, the spacing of the spaced regions, and the dimensions of the spaced regions are mutually adapted so that light propagation in the transducer includes a significant component that is directed transverse to the axis of the resonator. Thus, for example, a transducer in accordance with this embodiment of our invention functions as a surface-emitting ISB laser or as a vertically-illuminated intraband, unipolar photodetector.

In a preferred embodiment of an ISB laser, at least the upper cladding region is designed so that the peak intensity of the radiation is located within the depth of the periodic regions. In a further preferred embodiment, the upper cladding region includes an interface that interacts with the radiation so as to support surface plasmons.

Although one immediate advantage of our invention is the realization of surface-emitting ISB lasers, the potential impact is much broader. The dimensions of our resonators are greatly scaled down (e.g., ~50–100 µm) in comparison with those used in standard ISB technology (e.g., 1–3 mm), opening the way for the miniaturization and on-chip integration of ISB lasers for applications involving the use of multi-wavelength 2D ISB laser arrays for spectroscopy and imaging. For this reason we refer to our resonators as micro-cavity resonators.

In another embodiment, a nonlinear optical material is optically coupled to the micro-cavity resonator, which in one case allows an ISB laser to exhibit bistable operation.

BRIEF DESCRIPTION OF THE SEVERAL VIEWS OF THE DRAWING

Our invention, together with its various features and advantages, can be readily understood from the following more detailed description taken in conjunction with the accompanying drawing, in which:

FIG. 3(a) shows the low-temperature electroluminescence (EL) (I=700 mA, 50 ns pulse width at 84 kHz repetition rate) for a device with lattice spacing a=2.92 µm and radius-to-lattice-spacing ratio r/a=0.30 (Curve II). Curve III is the FDTD (finite-difference time domain) simulated spectrum for the same device. The reference spectrum (Curve I) was collected from a device with a=2.69 µm and r/a=0.28 (I=400 mA, 1 µs pulse width at 84 kHz repetition rate). For this device the PC is not in resonance with the peak material gain, and only the plain intersubband EL spectrum (FWHM~100 cm$^{-1}$) can be measured. The spectra were collected vertically from the top surface of the devices using a Nicolet Fourier transform infrared spectrometer (FTIR) operated in a step-scan mode and a liquid nitrogen-cooled HgCdTe detector. The spectral resolution was set to 4 cm$^{-1}$. The spectra of Curves I and II have been normalized.

DETAILED DESCRIPTION OF THE INVENTION

Before describing our invention in detail we first briefly describe two predicates: (1) the basic design of ISB lasers in general, and (2) design of photonic crystals, which can be used to form a micro-cavity resonator.

General ISB Laser Design

Figure 5:
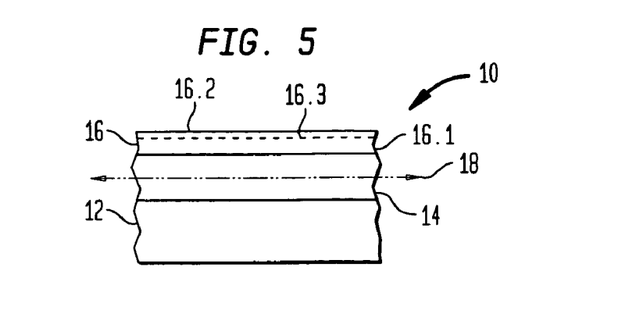
FIG. 5 is a schematic cross-section of a prior ISB light emitter.

Turning now to FIG. 5, we show a portion of a conventional ISB semiconductor light emitter (e.g., a QC laser) 10 comprising a core region 14 sandwiched between an upper cladding region 16 and a lower cladding region 12. The core region includes the active region of the laser. The active region, in turn, includes a multiplicity of essentially identical repeat units or stages; that is, the overall device is termed homogeneous. In a typical design, each stage includes a radiative transition (RT) region and an adjacent injection/relaxation (I/R) region. All stages are essentially identical to one another. Alternatively, the active region may be heterogeneous; that is, not all stages are identical to one another (e.g., not all emit at the same wavelength).

The term ISB in general refers to the well-known unipolar nature of the optical and electronic transitions that take place in the RT and I/R regions. These transitions are intersubband; that is, the transitions take place between states that are entirely in either the conduction band (in the case where the unipolar carriers are electrons) or the valence band (in the case where the unipolar carriers are holes). In contrast, in interband transitions of prior art diode lasers the transitions are bipolar; that is, they involve the radiative recombination of holes in the valence band with electrons in the conduction band.

Typically the substrate on which the various layers of the emitter are formed serves as the lower cladding region. Alternatively, an additional cladding region, separate from the substrate, may be formed between the substrate and the core region. Another alternative waveguide design exploits surface plasmons to form the upper cladding region 16, as described by F. Capasso et al. in U.S. Pat. No. 6,301,282, which issued on Oct. 9, 2001 and is incorporated herein by reference. In this case, the upper cladding region 16 includes at least one guiding interface 16.3 that is based on surface plasmons. Interface 16.3 is formed by a pair of layers 16.1 and 16.2 that have dielectric constants opposite in sign. Illustratively, layer 16.1 comprises a semiconductor having a positive dielectric constant, and layer 16.2 comprises a material having a negative dielectric constant. When layer 16.2 is a metal, it may also serve as an electrical contact. Preferably the imaginary component of the complex refractive index of layer 16.2 is much larger than its real component. A significant advantage of this type of surface plasmon waveguide is that the peak optical intensity is very close to the interface 16.3. We utilize this design in an illustrative embodiment of our invention, which is described later.

The substrate itself may be a single crystal semiconductor body or a combination of such a body with another layer (e.g., an epitaxial layer grown on the top surface of the body). Illustratively, lasers of this type are fabricated from Group III-V compound semiconductors; e.g., In-based Group III-V compounds such as GaInAs and AlInAs for operation at mid-infrared wavelengths of about 4–24 μm. At shorter wavelengths, Group III-V compounds such as GaN and AlGaN may be used. Within any particular materials system the specific wavelength of operation is determined primarily by the thickness of the quantum wells that make up the RT regions.

Drive circuitry (not shown) is coupled across electrodes (not shown in FIG. 5) in order to provide an external voltage bias and to supply pumping energy (e.g., electric current) to the laser of sufficient magnitude to generate light. Below threshold the emitter operates as an incoherent, spontaneous emission source, whereas above threshold it operates as a coherent, stimulated emission source. In the latter case, when provided with optical feedback, the source functions as a laser. The laser emission propagates in the direction of arrow 18 and emerges from the edges of the device. Suitable optical feedback is typically provided by an optical cavity resonator formed, for example, by cleaved crystal facets, distributed feedback (DFB) gratings, distributed Bragg reflectors (DBRs), or a combination of them. In contrast, however, our invention makes use of photonic crystals to form a micro-cavity resonator. In one embodiment, the resonator is designed so that laser emission also emerges through the top and/or bottom major surface of the device.

Photonic Crystals

Photonic crystals (PCs) are materials with a spatially periodic modulation of their dielectric constant (or refractive index), which can create a range of forbidden frequencies (i.e., a band-gap) and dramatically alter the photonic density of states (i.e., the group velocity of light inside the periodically modulated medium). A PC therefore affects the properties of photons in a manner analogous to the way that semiconductor crystals affect the properties of electrons. [See, J. D. Joannopoulos et al., *Nature*, Vol. 386, p. 143 (1997) and J. D. Joannopoulos et al., *Photonic Crystals*, Princeton University Press, Princeton, N.J. (1995), which are incorporated herein by reference.] Planar PC devices, employing a 2D photonic lattice with a conventional slab vertical waveguide, have been a particularly appealing device architecture due to the maturity of planar fabrication methods. [See, A. Scherer et al., *Opt. Phot. News*, Vol. 2, p. 9 (1991), which is incorporated herein by reference.] Two-dimensional PC slab waveguide lasers, which have typically operated at near-infrared (near-IR) wavelengths ($\lambda \approx 800$–1700 nm), can be divided in two families: defect mode lasers and band-edge mode lasers. Defect mode lasers operate at frequencies inside the band-gap by incorporating in the lattice an intentionally introduced defect that supports resonator modes with high spatial localization. [See, O. Painter et al., *Science*, Vol. 284, p. 1819 (1999), which is incorporated herein by reference.] Band-edge mode lasers, on the other hand, operate in regions of energy-momentum space that have a very high photonic density of states, and corresponding small group velocity, as a result of the 2D distributed feedback of the photonic lattice. [See, M. Imada et al., *Appl. Phys. Lett.*, Vol. 75, p. 316 (1999), which is incorporated herein by reference.] To date, defect mode lasers with cavity dimensions at the wavelength scale have been demonstrated in an optically-pumped configuration only, with the PC holes completely etched through a waveguiding core layer that is usually a thin, free-standing membrane. [See, O. Painter et al., supra, and H. Park et al., *Appl. Phys. Lett.*, Vol. 79, p. 3032 (2001), which are incorporated herein by reference.] In contrast, band-edge lasers typically have been reported as broad-area devices involving several hundred PC periods. These broad-area devices use a relatively shallow etch in a non-membrane geometry which is pumped either optically or electrically. [See, M. Imada et al., supra, and M. Notomi et al., *Appl. Phys. Lett.*, Vol. 78, p. 1325 (2001), which are incorporated herein by reference.]

ISB Laser Having a Micro-Cavity Resonator

Figure 6:
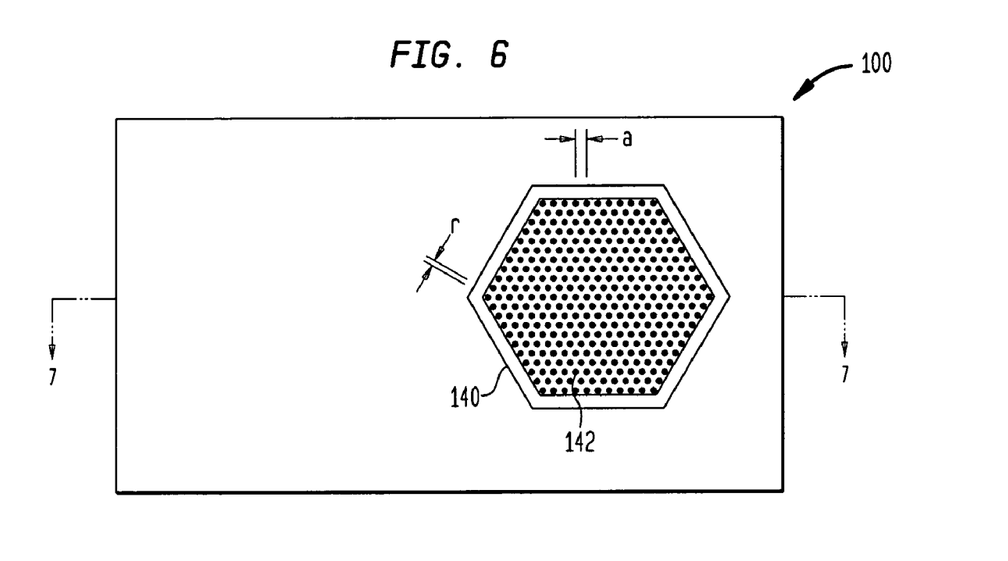
FIG. 6 is a schematic top view of a unipolar, intraband transducer in accordance with one embodiment of our invention.
Figure 7:
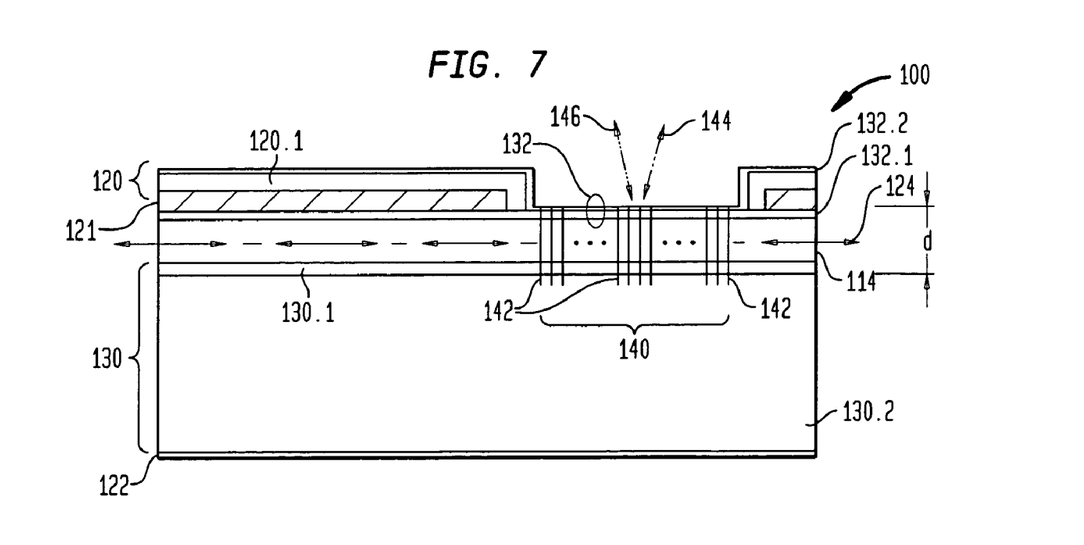
FIG. 7 is a cross-sectional view of the transducer of FIG. 6 taken along line 7—7. Outwardly directed light arrows 144, 146 represent light emission where the transducer is an ISB surface-emitting laser, whereas inwardly directed arrows 144, 146 represent vertical illumination where the transducer is a unipolar, intraband photodetector.

In accordance with one aspect of our invention, an ISB laser 100 is realized by means of a unique design of the type illustratively depicted in FIGS. 6 and 7. In this embodiment, the laser 100 comprises an active region 114 that includes a multiplicity of repeat units (not shown), each repeat unit including a unipolar RT region and an adjacent I/R region. Upper and lower cladding regions 130 and 132, respectively, bound the active region and form a waveguide having a first propagation axis 124. Electrodes 120 and 122 are used to supply a voltage bias and pumping energy (e.g., electric current) to the core region and to cause unipolar carriers to undergo a cascade of intersubband optical transitions within the RT regions. The optical radiation from these transitions initially propagates along the first propagation axis 124; that is, essentially parallel to the layers of the device.

In order to provide optical feedback for this radiation, one embodiment of our invention utilizes a 2D array of essentially equally spaced, essentially identical regions 142. As shown in FIG. 1(d), the regions 142 illustratively have a depth d, circular cross-sections of radius r, and a center-to-center spacing a. Other cross-sections (e.g., square, elliptical) are suitable.

In a top view, as illustrated in FIG. 6, the perimeter of the spaced regions 142 defines a closed polygon. Each of the spaced regions extends through the active region 114 in a direction transverse to first axis 124 and has an average refractive index that is different from that of the active region (thereby defining a refractive index contrast $\Delta n$ between the spaced regions and the active region). Illustratively, the regions 142 are air holes, but they could be filled with a material (e.g., a semiconductor, oxide or polymer) that has the requisite refractive index.

Typically the aspect ratio (d/2r) of each of the regions 142 is relatively high. For example, we have found an aspect ratio of about 2.5–3.0 to be suitable in illustrative embodiment s (described later) in which d~4.8 μm, a~2.7–3.0 μm, and r~0.8–1.0 μm.

Illustratively, the polygon is a hexagon. Hexagonal lattices of such regions have well-known photonic band-structures and are relatively straightforward to make. In addition, the lattice of spaced regions is electrically interconnected via the surrounding semiconductor and the overlying metal electrode. This connected nature makes for efficient injection of current into the active region.

In accordance with one aspect of our invention, $\Delta n$, a, and the dimensions (e.g., r, d) of the spaced regions 142 are mutually adapted so that the array functions as a micro-cavity resonator 140; that is so that at least one frequency of the resonant modes of the array falls within the gain spectrum of the active region. Mutually adapting the array's parameters involves well-known computer modeling to solve Maxwell's equations for the boundary conditions defined by $\Delta n$, a, and the dimensions of the spaced regions 142 for a given wavelength of operation of the laser. This design approach also allows the direction of the output emission to be controlled, which means that at least some portion of the stimulated emission can be diffracted out of the device in a direction that is transverse to first axis 124 (e.g., as indicated by outwardly directed arrows 144, 146). Note, the direction 144, 146 are not intended to be limiting as to the angle they make with the top surface of the laser. They represent any direction (including normal to the top surface) that has a component vertical to the top surface of the laser. Significantly, this embodiment of our invention enables us to generate a surface-emitting output notwithstanding the fact that the in-plane emission along first axis 124 is TM polarized.

The actual direction of the surface emission is determined first by the design of the micro-cavity resonator, as described above. More specifically, a 2D array of the type described above (i.e., a PC) is characterized by certain frequency bands where in-plane radiation slows down. This phenomenon occurs in certain preferred directions in momentum space, which correspond to certain directions in physical space (e.g., directions 144 and 146 of FIG. 6). Slowing down the radiation wave advantageously allows it to interact with the gain medium (i.e., the RT regions) for a longer time and, hence, increases the gain experienced by the radiation trapped inside the resonator. Along the preferred directions the spaced regions 142 act like a Bragg reflector to redirect radiation propagating along first axis 124 into radiation propagating along one or more surface-emitting directions such as 144 and 146.

Figure 1A:
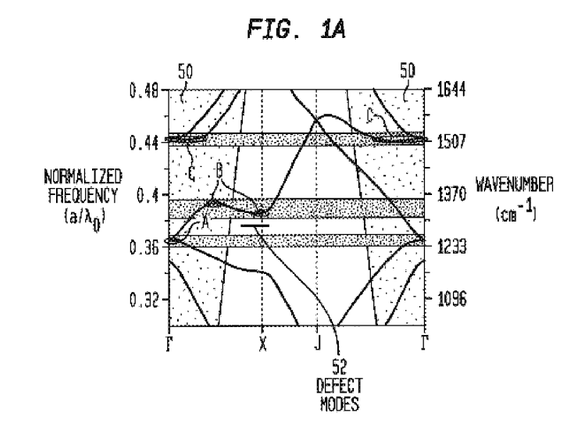
FIG. 1(a) shows the calculated 2D in-plane TM band structure for a hexagonal array or lattice of air holes (r/a=0.30, $n_{eff}$=3.345, where $n_{eff}$ is the effective refractive index of the structure including semiconductor and overlying metal, but not the air holes. The flat band (i.e., zero dispersion) regions, labeled A, B, and C, are indicated by dark oblong-shaped frequency bands. For the devices with a central defect, the energy position of the highly localized defect modes is indicated by the horizontal line 52 between bands A and B.

As shown in the array's band structure of FIG. 1(a), the preferred directions correspond to those zero-slope or zero-dispersion points A, B and C that are located within the light cone 50. The light cone itself represents those light rays that are capable of escaping from the structure and forming a useful optical output.

In a preferred embodiment, the upper cladding region 132 includes a semiconductor layer 132.1 that has a positive dielectric constant and a metal layer 132.2 that has a negative dielectric constant, as described in the Capasso et al patent, supra. A surface plasmon waveguiding interface is formed at the interface between layers 132.1 and 132.2 in the zone where the micro-cavity resonator 140 is formed. This design positions the peak intensity of the radiation at the guiding interface and, more importantly, positions the intensity profile of the radiation so that it overlaps the periodically spaced regions 142 along essentially their entire depth.

Illustratively, the lower cladding region 130 includes a first cladding region 130.1 that has a higher average refractive index than that of the core region and a second cladding region 130.2 (the substrate in this case) that has a lower average refractive index than that of first region 130.1.

In those cases where light propagation in the substrate is not desirable (e.g., when the substrate is absorbing), the micro-cavity resonator 140 is designed so that the amount of light that is diffracted downwardly into the substrate is significantly reduced. To this end, the regions 142 should extend all the way through the active region 114 into the lower cladding region 130. This design alters the photonic density of states (i.e., the group velocity of the light) in the lower cladding [See, B. D'Urso et al., *J. Opt. Soc. of America B—Optical Physics*, Vol. 15, No. 3, pp. 1155–1159 (1998)], which significantly reduces the amount of light diffracted into the substrate.

In order for this design to function effectively in this fashion, it is sufficient that two conditions are satisfied: (i) the refractive index $n_{130}$ of the lower cladding region 130 should be slightly smaller than the refractive index $n_{114}$ of the active region 114; e.g., $(n_{114}-n_{130})/n_{ave} < \frac{1}{6}$, where $n_{ave}$ is the average of $n_{114}$ and $n_{130}$; and (ii) the mean size of the regions 142 in the lower cladding region 130 should be the same or slightly larger (e.g., not more than about 10% larger) than the mean size of the holes in the active region 114. By size we generally mean the cross-sectional area of the regions 142 as measured in a plane perpendicular to the depth dimension, which is equivalent to saying that the size corresponds to the radius or diameter of regions 142 when they have circular cross-sections.

Note, however, it is possible to design our micro-cavity resonator so that the spaced regions 142 have slightly smaller size in the lower cladding than in the active region, provided that the average refractive index of the patterned lower cladding region 130 is lower than that of the patterned active region 114.

Figure 1B:
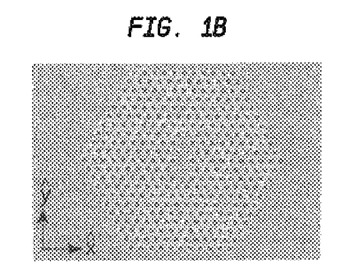
FIG. 1(b) is a top-view SEM image of a QC device at an intermediate stage of fabrication in which the hexagonal array of air holes forms a photonic crystal (PC) micro-cavity resonator. The array has a perturbation or defect in the form of a hole omitted from the center of the array, and the radius of some neighboring holes is reduced (the image was taken after the holes were etched in the semiconductor, but before the metal contact was deposited). Devices without the central defect had no holes omitted in the center, and all the holes had the same radius.

In an alternative embodiment of our invention that provides additional design flexibility, the uniformity of the essentially equally spaced, essentially identical regions of the micro-cavity resonator is perturbed; i.e., the laser constitutes a defect mode laser. For example, one or more of the spaced regions may be omitted. FIG. 1(b) illustrates the case where a single air hole has been omitted from the center of the hexagon lattice, and the radius of some neighboring holes has been reduced. Alternatively, the perturbation can be introduced by changing the refractive index of one or more regions relative to its/their surrounding regions; by changing the radius of one or more regions relative to its/their surrounding regions, which is also shown in FIG. 1(b); by changing the spacing between two or more regions relative to their surrounding regions; or by positioning the perturbation at a location other than the center. In these embodiments the lasing mode tends to localize around the perturbation, which means that the mode volume can be altered (in particular, reduced) by introducing a suitable perturbation into the periodicity of the micro-cavity resonator. In general, the number of (unperturbed) essentially equally spaced regions surrounding the perturbed region is a matter of design based on such factors as the gain of the active region and the optical losses of the cavity (i.e., the amount of optical confinement provided by the surrounding, unperturbed regions).

Figure 2A:
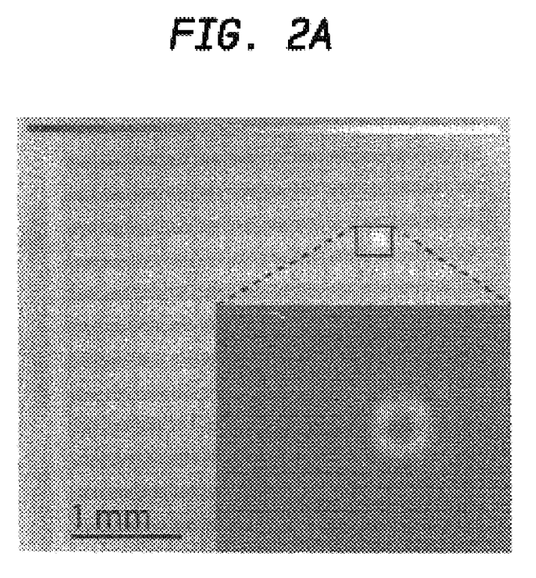
FIG. 2(a) is a microbolometer camera image of a 2D array of PC QC lasers. Each rectangle corresponds to the metal contact pad on the top of each laser. The microbolometer camera is sensitive in the range 7 µm<λ<14 µm. The inset shows a close up of the lasing emission, while the device was being operated in pulsed mode at 100 kHz repetition rate, with a pulse width of 40 ns.

Although FIGS. 6 and 7 show individual ISB laser chips, it is readily possible to fabricate arrays of surface-emitting ISB lasers. Moreover, the arrays may be designed so that the micro-cavity resonators are identical to one another and, therefore, so that all lasers emits at the same center wavelength. Alternatively, the parameters a and r/a may be different in different ones of the micro-cavity resonators so that each laser emits at a different center wavelength. Thus, a multi-wavelength array of ISB lasers can be realized. Indeed, FIGS. 2(a) and 2(d) illustrate a multi-wavelength array of single-mode ISB lasers.

Gas Sensing Application

Figure 8:
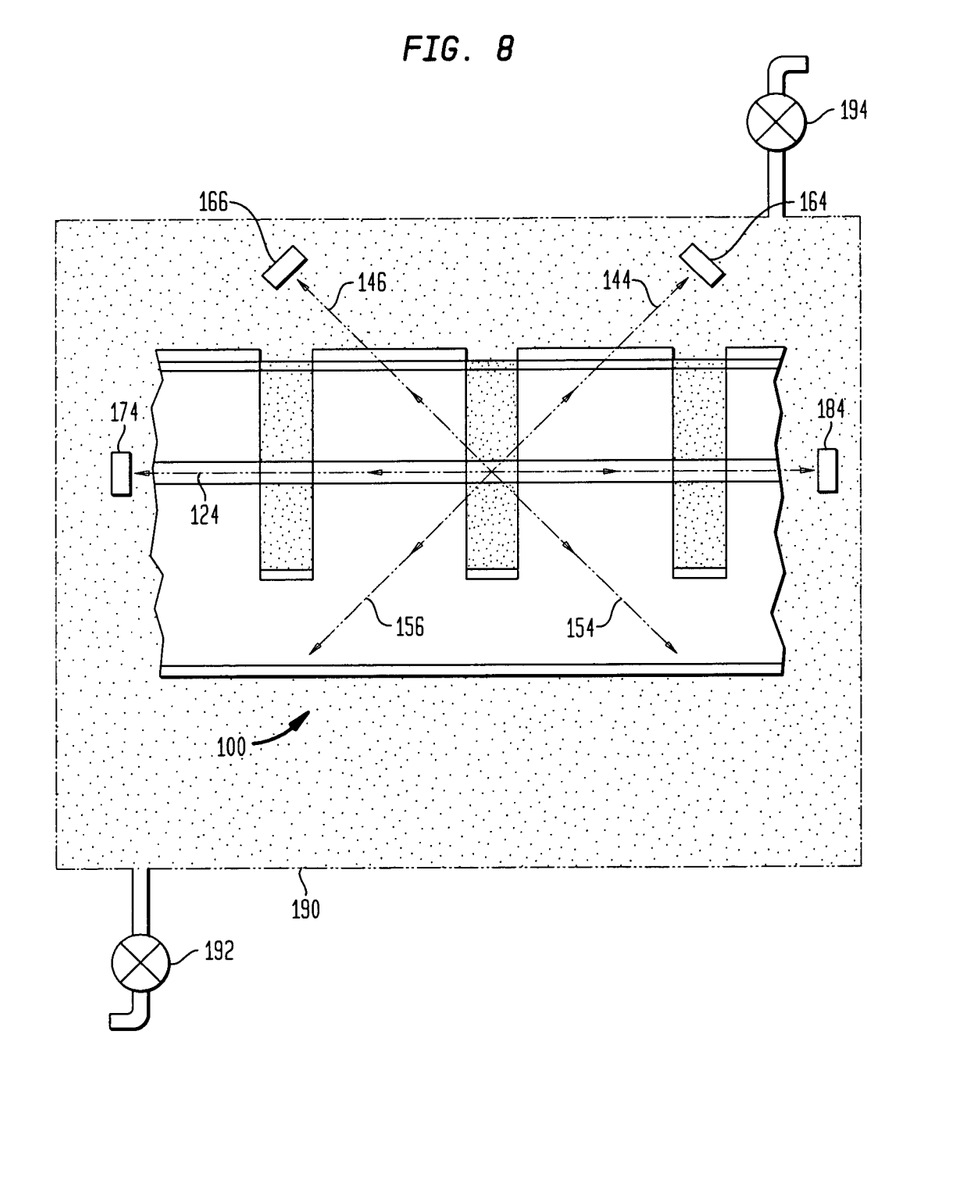
FIG. 8 is an expanded view of a portion of the transducer of FIG. 7 illustrating how, as an ISB laser, the device can be used in a trace-gas sensing application.

Because most ISB lasers operate at mid-IR and far-IR wavelengths, one of their principal applications is in trace-gas sensing; e.g., detecting pollution in the atmosphere. The embodiment of our invention in which the spaced regions are formed by air holes is particularly useful in such applications, as shown in FIG. 8. Illustratively, the laser 100 is disposed within a gas chamber 190, and the atmosphere to be detected flows into and out of the chamber via pumps 192 and 194. In this case, merely positioning the laser in the atmosphere that is suspected to contain the trace gas will cause the gas to enter the air holes where it will absorb the laser radiation. We use the term fluid-flow communication to describe that the gas enters the holes, whether the gas enters by diffusion (e.g., by a pressure gradient) or by force (e.g., by means of a pump). Absorption will occur by radiation propagating along any of the surface-emission directions (e.g., 144, 146, 154 and 156) as well as along the in-plane axis 124. The radiation, which is amplitude modulated by the absorption process, is detected by one or more photo-detectors (e.g., 164, 166, 174 and 184).

EXAMPLE

ISB Laser

This example describes Group III-V compound semiconductor surface-emitting ISB lasers of both the band-edge variety and the defect-mode variety. (Note, the defect-mode device lased on band-edge states, which are also allowed modes in such lasers.) Various materials, dimensions and operating conditions are provided by way of illustration only and, unless otherwise expressly stated, are not intended to limit the scope of the invention.

In this example, the micro-cavity resonator was formed by etching essentially equally spaced air holes that penetrated through the core region and extend deep into the lower waveguide cladding. The deep holes, which had a relatively high aspect ratio (d/2r~2.5–3.0) were arranged in a hexagonal pattern, altered the photonic density of states in the lower semiconductor cladding, providing efficient vertical optical confinement. [See, B. D'Urso et al, *J. Opt. Soc. Am. B*, Vol. 15, p. 1155 (1998)], which is incorporated herein by reference.] This design allowed for a high-index contrast semiconductor-air 2D grating to provide strong in-plane optical feedback. As a result, the band-edge devices of this example utilized only ten periods (counting from the center) of the photonic lattice (less than 8 wavelengths in diameter), and were in fact effectively no larger in size than resonant cavities with a central defect region in the lattice, hence we define them as micro-cavity lasers. Typically the defect is extremely small (e.g., a few μm) relative to the size of the resonator (e.g., a few hundred μm). Hence, the laser is appropriately called a micro-cavity laser. Our band-edge lasers had the same overall size (e.g., a few hundred μm), so that they too are termed micro-cavity lasers.

As a starting point for our analysis, we treated the system as being approximately 2D by incorporating an effective refractive index for the dielectric material, chosen to equal the effective index of the fundamental vertical waveguide mode. [See, O. Painter et al., *J. Opt. Soc. Am. B*, Vol. 16, p. 275 (1999), which is incorporated herein by reference.] The hexagonal PC array of air holes was chosen not for the frequency band-gaps it forms (in 2D this lattice does not have a frequency band-gap for TM polarized light), but rather because of its connected nature, as discussed previously. Note that the absence of a full 2D band-gap does not imply that strongly dispersive flat-bands cannot be formed for creating low-loss band-edge states, or that highly localized defect states cannot be formed. [See, K. Srinivasan et al., *Opt. Express*, Vol. 10, p. 670 (2002), which is incorporated herein by reference.] The main criterion is that the photonic lattice should provide high phase-velocity contrast (i.e., a low group velocity) so that strong optical feedback can be obtained over several lattice periods, setting the scale of our lasers. The calculation of the in-plane band-structure for TM-polarized light, shown in FIG. 1(a), was performed using the plane wave expansion method with an effective index of $n_{eff}=3.35$ to account for the optical confinement normal to the plane of the semiconductor surface (See below and FIG. 1.) and with hole radius to lattice spacing ratio of r/a=0.30. [See, K. Sakoda, *J. Appl. Phys.*, Vol. 84, p. 1210 (1998), which is incorporated herein by reference.] In this figure frequencies around the bands formed predominantly from the primitive reciprocal lattice vectors of the hexagonal lattice (second-order diffraction) are shown. It is these bands that flatten underneath the air light-cone regions 50 of FIG. 1(a) and where the Bloch modes can radiate into the air for surface emission. In particular, we show three different frequency bands, labeled A, B, and C, which surround the flat-band regions in the frequency range probed by the array of devices fabricated and tested in our experiments. In finite lattice structures such as the cavities described here and shown in FIGS. 1(b), 6 and 7, strong resonance peaks formed around the flat-band regions, each resonance peak consisting of a number of cavity resonant modes, the details of which are determined by the boundary of the polygon lattice. To place these band-edge resonances within the gain spectrum of the active region, which was centered about a center wavelength of 8 μm, our approximate 2D analysis indicated that the lattice spacing should be approximately a~2.9 μm (resulting in r~0.9 μm). The appropriate lattice spacing can also be gauged through a simple analysis which estimates the second-order diffraction condition for the vertical waveguide mode, where the average refractive index seen by the guided mode is set by the filling fraction f of dielectric material of the hexagonal lattice, $f=1-2\pi/\sqrt{3}(r/a)^2$. The approximate average refractive index is then $\bar{n}\sim 1+(n_{eff}-1)f=2.58$, which gives for the second-order grating period, $\Lambda=\lambda/\bar{n}\sim 3.05$ μm for an 8 μm emission wavelength, close to the average lattice parameter of the A, B, and C frequency bands of FIG. 1(a).

Figure 1C:
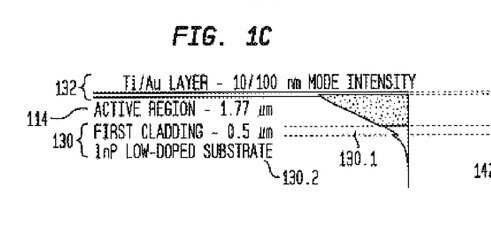
FIG. 1(c) shows the layer structure of the device and intensity profile of the surface plasmon mode inside the semiconductor material. The etch depth was chosen such that the holes penetrated through the lower cladding region and well into the substrate, in order to completely overlap with the mode in the vertical direction. The thicknesses of the surface-plasmon metal layer (Ti/Au-10/100 nm), the active region (1.77 µm) and the lower cladding (0.5 µm) are also shown. The detailed layer structure of the core region is described in by C. Gmachl et al., *Appl. Phys. Lett.*, Vol. 72, p. 3130 (1998), which is incorporated herein by reference.
Figure 1D:
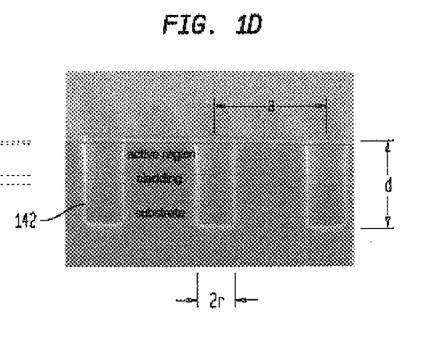
FIG. 1(d) shows a cross-section SEM of a portion of a PC QC device, showing the high surface quality of the etched holes and their depth (~4.8 µm). The interfaces between the core region, cladding layer, and InP substrate are marked with dotted lines.

Confinement of light in the third direction (i.e., normal to the top major surface) is mainly determined by the upper cladding region 132, which included semiconductor-metal surface plasmon interface as depicted in FIGS. 1(c) and 7. This waveguiding, which has been treated up to now simply through an effective waveguide index, reduced the symmetry of the system resulting in mixing of TE and TM polarizations. Significantly, it also allowed radiation to emerge from the device in other directions; e.g., either downwards into the substrate or vertically into the surrounding air. Although the above 2D analysis provided quantitative results for the in-plane lattice parameters, care should be taken in the design of the patterned vertical waveguide in order to reduce parasitic (lossy) scattering into the absorbing substrate (e.g., along directions 154 and 156 of FIG. 8). Such care entails controlling the depth d of the air holes, as well as their lateral size and spacing.

The core region in these devices was based on a so called 3-well vertical transition design (λ~8 μm) as described by C. Gmachl et al., *Appl. Phys. Lett.*, Vol. 72, p. 3130 (1998), which is incorporated herein by reference. The semiconductor layers of the devices were grown by molecular beam epitaxy (MBE) on a low-doped InP substrate. The laser design employed a surface-plasmon waveguide to achieve vertical optical confinement. [See, C. Sirtori et al., *Opt. Lett.*, Vol. 23, p. 1366 (1998), which is incorporated herein by reference.] As mentioned earlier, this type of waveguide exhibits a maximum of the electromagnetic field intensity at the top semiconductor-metal interface, and results in a predominantly TM-polarized guided mode.

Also of particular relevance to our experiments was the moderate thickness of the epitaxial layers (2.4 μm compared to 5.2 μm for a standard fully dielectric waveguide) and the absence of AlInAs claddings in surface plasmon waveguides, both of which dramatically eased the process of etching the deep air holes shown in FIG. 1(d).

Figure 2B:
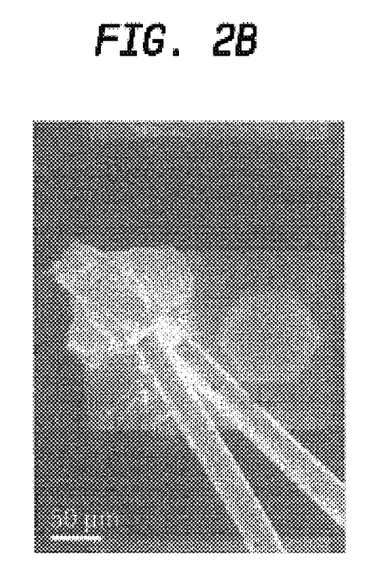
FIG. 2(b) is an SEM image of a wire-bonded laser. The central patterned region sits in a hexagonal opening in the rectangular metal contact pad. The total device size of each laser in the 2D array was 210×150 µm, with the micro-resonator region being roughly 60 µm in diameter.
Figure 4A:
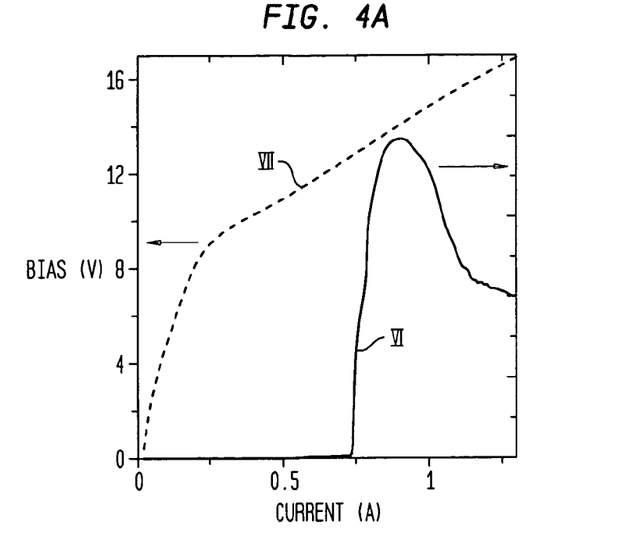
FIG. 4(a) shows the current-light power (L-I) characteristic (Curve VI) for a typical device at 10K. The lasers were operated in pulsed mode with 50 ns pulse width at 5 kHz repetition rate. Curve VII is a current voltage characteristic for the same device. The peak power for the devices with the defect is in the range 400 µW to 1 mW, whereas the devices without a defect were less powerful.

The principal processing steps utilized in the fabrication of our lasers are described as follows in conjunction with FIGS. 1 and 6–8. First, the various semiconductor layers making up the core and cladding regions were epitaxially grown by MBE on the InP low-doped substrate 130.2. After depositing a hard mask layer of silicon dioxide (250–750 nm thick) onto the semiconductor wafer by plasma-enhanced chemical vapor-deposition (PECVD), the hexagonal PC pattern was written using electron beam lithography, as shown in FIG. 1(b). The e-beam resist pattern was transferred to the underlying silicon dioxide mask layer via a fluorine-based reactive ion etching step, and the transfer to the semiconductor was achieved using a chlorine-based inductively-coupled plasma reactive ion etching step, which importantly produced nearly 90-degree sidewalls, as shown in FIGS. 1(d) and 8. Next, an electrically-insulating layer of silicon nitride 121 was deposited on the sample, and hexagonal windows were opened at the device sites using contact optical lithography with an image reversal process. No mesa was etched around the devices. Therefore, only the openings in the nitride pattern defined the regions of current injection. A thick, low resistance contact layer 120.1(Ti/Au, 30/300 nm) was deposited on the patterned silicon nitride layer 121 to enable wire bonding [FIG. 2(b)]. The sample was then thinned to a thickness of ≈300 μm, a metal back-contact 122 (Au/Ge/Ag/Au, 12/27/50/300 nm) was deposited, and the surface-plasmon current-carrying metal layer 132.2 (Ti/Au, 10/100 nm) was vertically evaporated onto the top surface of the device. The significance of etching vertical sidewalls in the air holes 142 profile is now evident: the deposition of metal layer 132.2 must provide the topside contact while preventing electrical shorting of the top contact to the substrate. In this process metal is deposited on top of the structure between the tops of the holes and on the bottom of the holes, but not on the sidewalls, as confirmed by the I-V characteristic of the device shown in FIG. 4(a).

We fabricated two-dimensional arrays of devices in which the periodicity a and the radius r of the air holes were systematically varied (a was varied between 2.69 μm and 3.00 μm along one axis of the array; r/a was varied between 0.28 and 0.32 along the other axis). This approach allowed tuning of the PC modes to the peak of the QC material gain spectrum by selecting different devices in the array. In addition, two sets of devices, with and without a central defect, respectively, were fabricated for comparison purposes. Electroluminescence (EL) measurements were performed at a temperature of 10 K, and surface emission was collected from the top major surface of the devices.

Figure 3A:
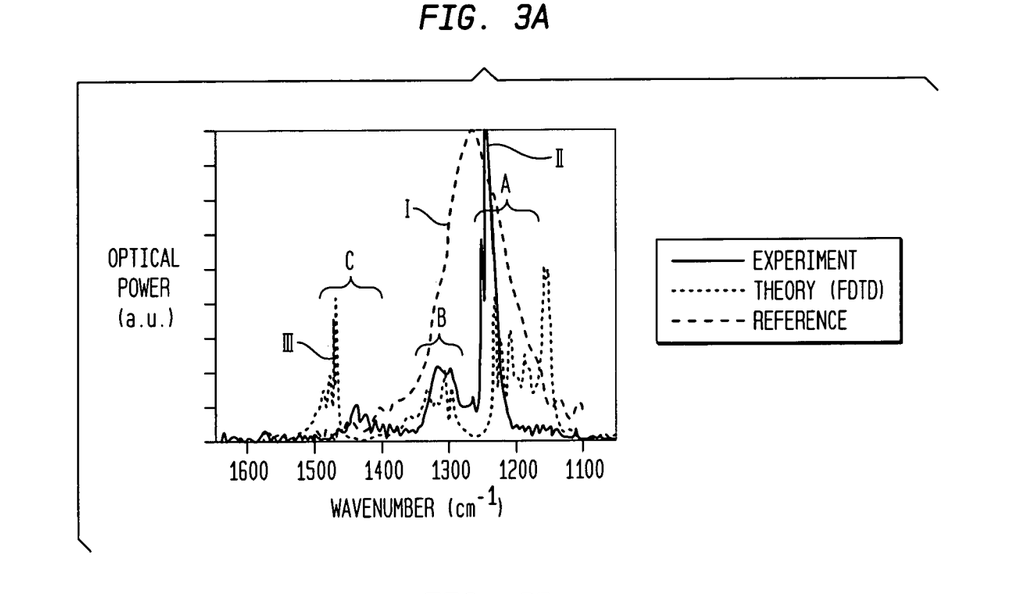
FIG. 3(b) shows the frequency tuning of the A, B and C bands as a function of a and r/a. EL spectra for several devices with varying values of a and r/a are shown. The shaded area 54 corresponds to the FWHM of the QC gain spectrum. The PC resonances become visible only when they overlap with the emission spectrum of the host material.
FIG. 3(c) shows the tuning of the A, B, and C resonances as a function of r/a for a series of devices with different lattice spacings a, all plotted in normalized frequency units (i.e., a/L). Measured values are given by data points. The three dashed lines represent fits to FDTD simulations of the same devices.
FIG. 3(d) shows a close-up of the A-band for applied currents below (Curve IV) and above (Curve V) laser threshold. The sub-threshold spectrum (I=700 mA, 50 ns pulse width at 84 kHz repetition rate) reveals that the peak is actually composed of three narrower resonances. This behavior has been observed in each of the tested devices. The laser line (Curve V) always starts from the highest wavenumber peak within the A-resonance. The laser emission was measured in rapid scan mode with the instrument resolution set to 0.125 cm$^{-1}$.
Figure 3B:
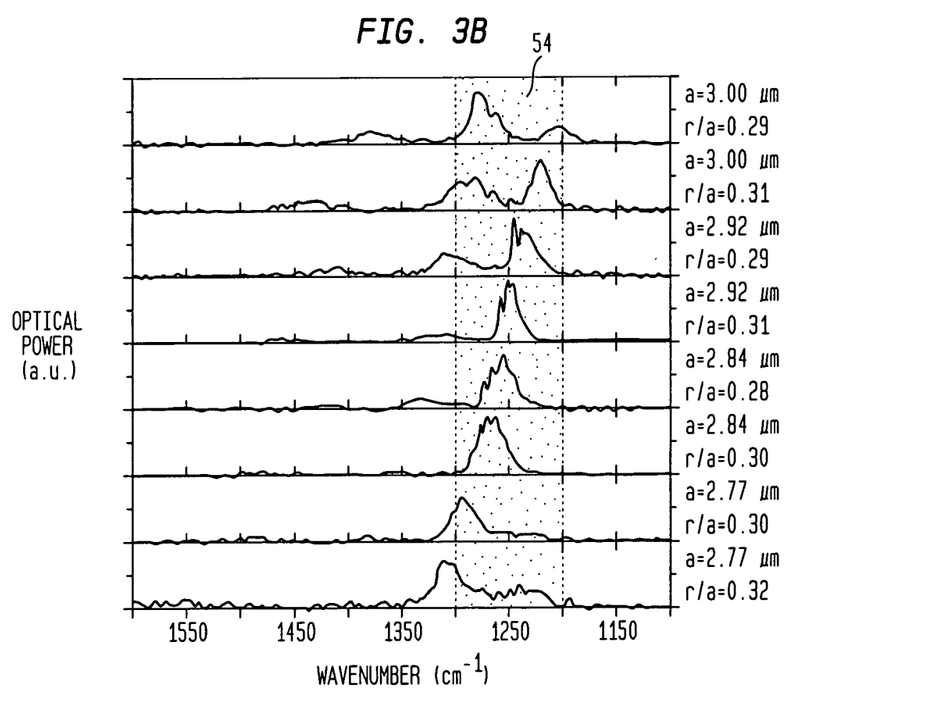

FIG. 3(a) (Curve I) shows that when the PC modes of the hexagonal array are not in resonance with the gain spectrum peak (for detuned hole radius or lattice spacing), the emission has a near-Lorentzian shape with a full-width at half-maximum (FWHM) of ~100 cm$^{-1}$ centered at the design wavelength of the core region. No line-narrowing (indicative of gain) is observed even at very high injection currents. For values of a and r where the PC modes overlap with the gain spectrum peak, three narrow sets of resonances (labeled A, B, and C) emerge on top of the broad EL spectrum, as shown by Curve II. The labeling of the resonances corresponds to the nomenclature chosen in the photonic band structure calculation of FIG. 1(a). The spectral position of these resonances can be tuned as a function of lattice spacing and hole radius as shown in FIG. 3(b), demonstrating that the resonances are indeed related to Bragg scattering in the micro-cavity.

Figure 3C:
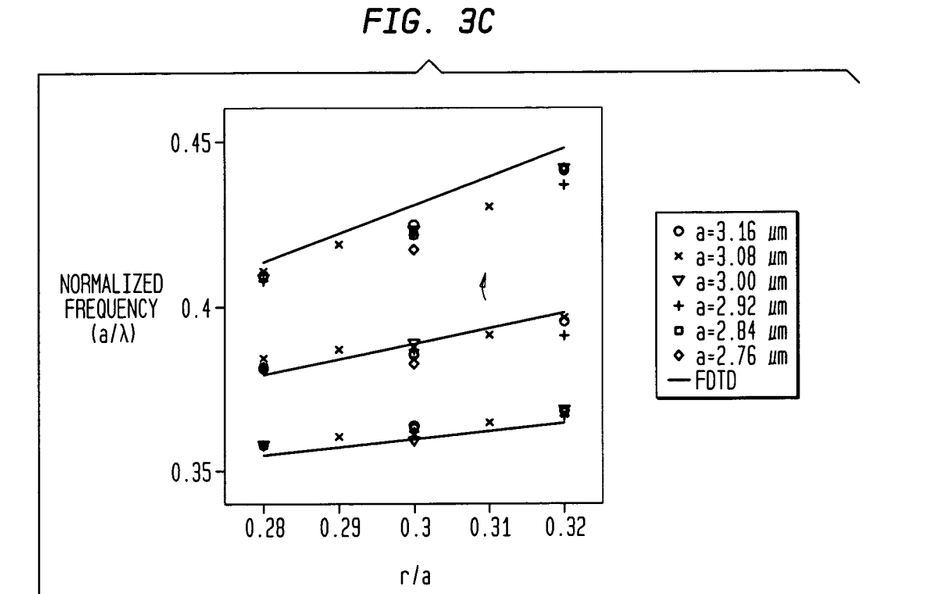

To better understand the nature of these resonances, we performed 2D finite-difference time-domain (FDTD) simulations. An FDTD-generated modal spectrum is shown overlaid upon the experimental results in FIG. 3(a) (Curve III), showing the presence of three sets of resonances, in accordance with the experimental results and with the three sets of resonances predicted in the photonic band structure calculations. To further establish the consistency between the band structure and the microcavity modes calculated with FDTD, we examined the near-field profiles of modes from within each of these bands of resonances, and confirmed that their dominant Fourier components are consistent with the k-space positions of the band-edge resonances labeled in FIG. 1(a). The near-field profiles also show that resonance C displayed a strong field overlap with the air holes, while resonances A and B have fields that were largely confined to the semiconductor regions. As a result, we expected that resonance C would tune more strongly as a function of the hole radius than resonances A and B. This expectation was confirmed in both experimental and FDTD results [FIG. 3(c)], and positively identified the highest wavenumber set of resonances in the experimental plot of FIG. 1(a) as the C band. These modes had the shortest wavelength since their effective refractive index was smaller due to their large overlap factor with the air holes. This condition, therefore, required a shorter wavelength to satisfy the Bragg condition ($\lambda > an_{\text{eff}}$) for our devices since they represented a second order grating. The C-band of resonances then provided a reference point from which the A- and B-bands were identified.

Figure 3D:
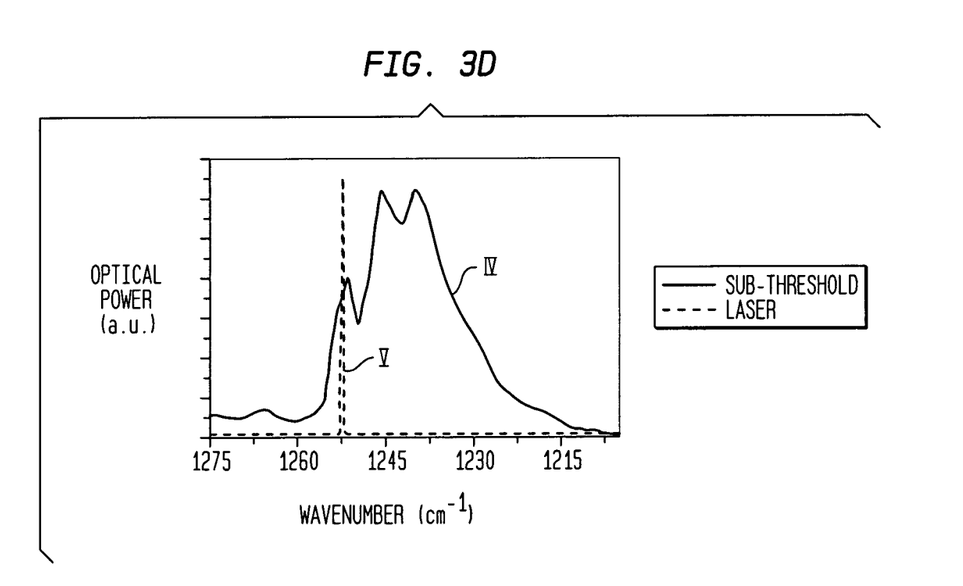
Figure 4B:
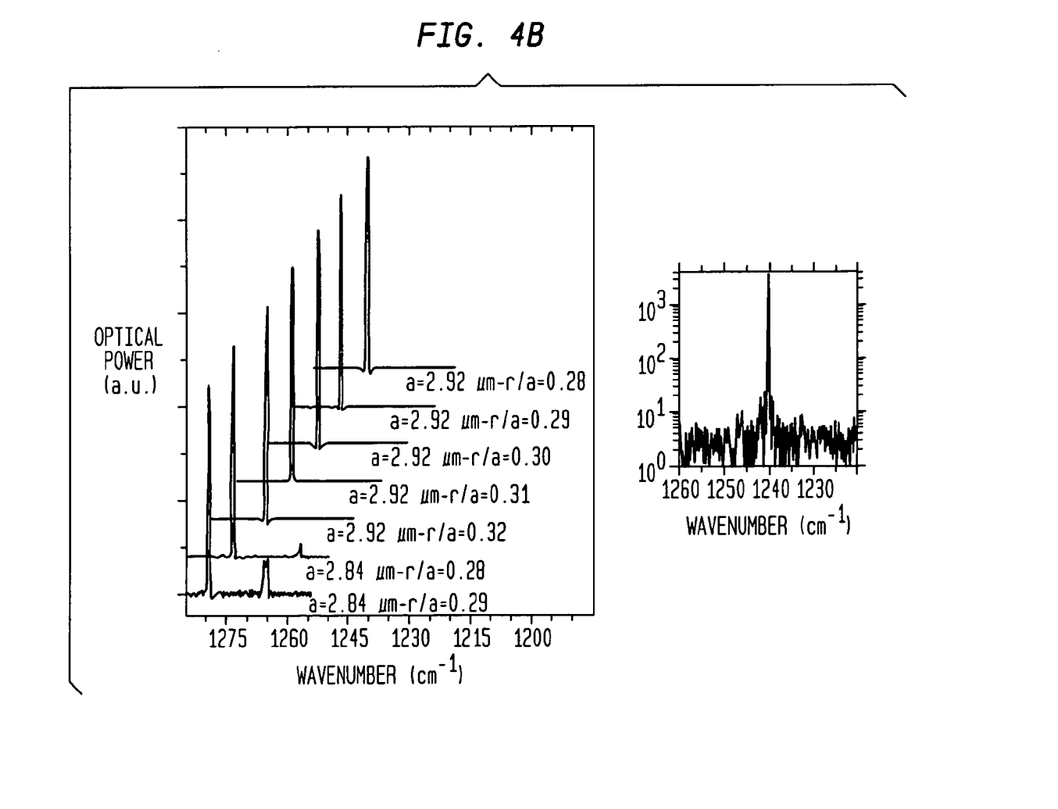
FIG. 4(b) shows the tuning of the laser emission wavelength as a function of a and r/a for several different devices located on the same semiconductor chip. The PC QC lasers operated predominantly in single mode (see inset) with a sidemode suppression of at least 20 dB. Two of the devices also showed the presence of a second, lower frequency mode, corresponding to the third resonance within the A-band [See FIG. 3(d)]. All the measurements were performed with a Nicolet FTIR in rapid scan mode and a nitrogen-cooled HgCdTe detector. The instrument resolution was set to 0.125 cm$^{-1}$.

FIG. 3(d) shows a close-up of the A-band of resonances for one of the lasers, revealing that it was actually composed of three narrower peaks. Such behavior was common to all the measured devices and was also in agreement with FDTD simulations. With further increase in applied current those devices with resonances best aligned with the gain peak reached lasing threshold. Laser emission always started from the highest wavenumber resonant mode of the A-band of resonances, as shown by FIG. 3(d). The behavior of the current-voltage (I-V) characteristic of a typical device, shown in FIG. 4(a), indicates that the device fabrication was successful and the large sidewall surface of the holes and the deposited metal did not contribute to the leakage current. On the other hand, the somewhat soft turn-on of the I-V was probably due to relatively low current confinement; that is, no mesa was etched around the devices, and the region of current injection was defined only by the opening in the SiN pattern. The absence of a mesa, chosen as an experimental expedient to eliminate Fabry-Perot like resonances, also makes it difficult to give an accurate estimate of the local current density at threshold for laser action, since the actual area across which the injected current was spread is not known. We nevertheless estimated a threshold current density in the range of 9–10 kA/cm$^2$ by taking into account a factor of ~2 for current spreading. This value should be compared with a threshold of ~5 kA/cm$^2$ obtained from the same QC core region material processed into conventional mesa stripes. Etching a mesa around our PC QC devices may reduce its threshold current density. However, for these experiments the absence of a mesa was a key feature since it ruled out other feedback mechanisms for the laser and confirmed that the PC itself was acting as a micro-cavity. The majority of the PC QC devices exhibited single mode laser emission in a pulsed mode, with a side mode suppression ratio of at least 20 dB, as shown in the inset of FIG. 4(b), inset). The output wavelength could also be accurately tuned by selecting—from the same semiconductor chip—devices with different lattice spacings or hole radius, as shown in FIG. 4(b).

It is to be understood that the above-described arrangements are merely illustrative of the many possible specific embodiments that can be devised to represent application of the principles of the invention. Numerous and varied other arrangements can be devised in accordance with these principles by those skilled in the art without departing from the spirit and scope of the invention. In particular, our invention may be employed in the design of bistable lasers or vertical-illumination photodetectors, as described below.

Bistable Lasers

In accordance with another embodiment of our invention, an ISB laser exhibits bistability in its light intensity-versus-drive current characteristic; that is, the light-current (L-I) characteristic is hysteretic and exhibits two stable light intensity states; for example, an upper intensity state corresponding to an applied bias current above an upper bias current threshold, and a an lower intensity state corresponding to an applied bias current below a lower bias current threshold. The state of operation depends on the history of the applied bias current, and the laser is switched between the two stable states by means of a suitable current pulse that increases (decreases) the bias current above (below) the upper (lower) threshold.

To this end, the laser includes a nonlinear optical material (NOM), which is optically coupled to the micro-cavity resonator and preferably is located in an area where the optical intensity in relatively high. For example, the spaced regions 142 could be filled with a NOM, or a layer of NOM could overlay the metal layer 132.2 at least in the region of the resonator 140 (FIG. 7). The latter embodiment is especially suited to the laser design that incorporates surface plasmon guiding since the optical field peaks at the interface between layers 132.1 and 132.2 (FIG. 7).

Among the many NOMs known in the prior art, the material selected for this embodiment of our invention should have the following characteristics: (1) an intensity-dependent refractive index coefficient ($n_2$) such that $n_2 I_o$ (where $I_o$ is the optical intensity) is large enough that the wavelength (as measured in the material) shifts by an amount of the order of, or greater than, the width (i) of the lasing Bragg mode (in the case of a micro-cavity resonator without a perturbation zone) or (ii) the lasing defect mode (in the case of a micro-cavity resonator with a perturbation zone). Under these circumstances, the laser intensity decreases, and if the decrease is sufficiently large, the laser shuts off; (2) the NOM should not introduce significant optical loss into the micro-cavity resonator; and (3) the processing of the NOM should enable the etched holes to be refilled to form the requisite spaced regions 142.

Illustrative NOMs that can be utilized include chalcogenides, which have $n_2$ of about $10^{-13}$ cm$^2$/W, or dye-doped nematic liquid crystals, which have $n_2$ in the range of about $10^{-3}$ to $10^{-2}$ cm$^2$/W.

Vertical-Illumination Photodetectors

With reference again to FIG. 7 note that the inwardly directed light arrows 144, 146 represent an embodiment of our invention in which the transducer is used as a vertical-illumination photodetector. Although the active region of the photodetector could have a design similar to that of an ISB emitter, it could also have the design of a more efficient unipolar, intraband device such as a QWIP. In either case, however, the photodetector is provided with a micro-cavity resonator of the type described above; i.e., a resonator that enables vertical illumination 144, 146 (i.e., light directed transverse to resonator axis 124) to be redirected to in-plane radiation along axis 124, where it is absorbed by active region 114. This absorption process causes unipolar carriers to undergo intraband optoelectronic transitions, thereby generating photocurrent that is collected via electrodes 120, 122.

As with the surface-emitting laser embodiment described above, $\Delta n$, a, and the dimensions (e.g., r, d) of the spaced regions 142 are mutually adapted so that the array functions as a micro-cavity resonator; that is so that at least one frequency of the resonant modes of the array falls within the absorption spectrum of the active region. In particular, well-known computer modeling is used to solve Maxwell's equations for the boundary conditions defined by $\Delta n$, a, and the dimensions of the spaced regions 142 for a given center wavelength of operation of the photodetector. This design approach also allows vertical illumination (e.g., as indicated by inwardly directed arrows 144, 146) to be redirected along axis 124 and to be absorbed more efficiently by the active region. Note, the directions 144, 146 are not intended to be limiting as to the angle they make with the top surface of the photodetector. They represent any direction (including normal to the top surface) that has a component vertical to the top surface of the photodetector. Significantly, this embodiment of our invention enables us to detect vertical illumination notwithstanding the fact that the in-plane radiation propagating along axis 124 is TM polarized.

The presence of the micro-cavity resonator increases the sensitivity of our photodetector by keeping the detected light within the active region for a longer period of time compared to a generic detector with a similar active region but without a resonator.

In addition, if a design objective includes a specialized response function (i.e., detection sensitivity versus wavelength), then the detector could include a perturbation in the array of spaced regions, as previously described for ISB lasers.

We claim:

1. A unipolar optoelectronic transducer comprising:
    an active region in which unipolar carriers undergo intraband optoelectronic transitions in response to the application of energy thereto, said active region exhibiting a frequency spectrum of an optoelectronic parameter, characterized in that
    a 2D array of essentially equally spaced regions exhibits resonant modes at particular frequencies,
    each of said spaced regions has a depth that extends through said active region,
    each of said spaced regions has an average refractive index different from that of said active region, thereby defining a refractive index contrast between said spaced regions and said active region, and
    said refractive index contrast, the dimensions of each of said spaced regions, and the spacing of said spaced regions are mutually adapted so that said array is a micro-cavity resonator having its axis along a first direction and so that at least one frequency of said modes of said 2D array falls within said parameter spectrum of said active region.

2. The transducer of claim 1 in an ISB laser, wherein said parameter spectrum is the gain spectrum of said active region in which said transitions generate stimulated emission of radiation in response to the application of said energy in the form of electric current thereto.

3. The transducer of claim 1 in a band-edge ISB laser, wherein said array has a band structure that exhibits flat bands and the said modes are located at or near said flat bands.

4. The transducer of claim 2 in an ISB laser, wherein said refractive index contrast, the dimensions of each of said spaced regions, and the spacing of said spaced regions are also mutually adapted so that a significant portion of said radiation is deflected out of said resonator along a second direction transverse to said first direction.

5. The transducer of claim 2 in an ISB laser, further including upper and lower cladding regions that bound said active region, at least said upper cladding region being designed so that the peak intensity of said radiation is located within said depth of said spaced regions.

6. The transducer of claim 5 in an ISB laser, wherein said upper cladding region comprises first and second layers forming a radiation-guiding interface therebetween, said interface interacting with said radiation to support surface plasmons.

7. The transducer of claim 2 in an ISB laser, further including upper and lower cladding regions that bound said active region, the refractive index of said lower cladding region being slightly smaller than that of said active region.

8. The transducer of claim 7 in an ISB laser, wherein the size of said spaced regions in said lower cladding region is not smaller than the size of said spaced regions in said active region.

9. The transducer of claim 1, wherein said spaced regions are formed by air holes.

10. The transducer of claim 9 in an ISB laser for use in trace gas sensing apparatus, further including means for causing said air holes to be in fluid-flow communication with said trace gas.

11. The transducer of claim 1, wherein said spaced regions are uniformly periodically spaced within the perimeter of a polygon.

12. The transducer of claim 1, wherein said spaced regions have a perturbation in a predetermined zone.

13. The transducer of claim 12, wherein said perturbation comprises the absence of at least one of said spaced regions in said zone.

14. The transducer of claim 12, wherein said perturbation comprises in said zone at least one spaced region that has a dimension different from that of surrounding spaced regions.

15. The transducer of claim 11, wherein said zone is centrally located within said perimeter.

16. The transducer of claim 11, wherein said polygon is a hexagon.

17. The transducer of claim 2 in an ISB laser, wherein said zone alters the volume of the mode of said radiation.

18. The transducer of claim 2 in an ISB laser, wherein said active region generates said radiation with TM polarization.

19. The transducer of claim 1 in a unipolar, intraband photodetector, wherein said parameter spectrum is the absorption spectrum of said active region in which said transitions generate a photocurrent in response to the application of said energy in the form of an optical signal thereto.

20. The transducer of claim 19 in a unipolar, intraband photodetector, wherein said refractive index contrast, the dimensions of each of said spaced regions, and the spacing of said spaced regions are also mutually adapted so that a significant portion of said signal is absorbed within said active region when said signal propagates along a second direction transverse to said first direction.

21. The transducer of claim 1, further including a non-linear optical material optically coupled to said resonator.

22. The transducer of claim 21, wherein said nonlinear optical material comprises a layer that overlays said resonator.

23. The transducer of claim 21, wherein said spaced regions comprise a nonlinear optical material.

24. The transducer of claim 23 in an ISB laser, including means for applying electric bias current to said active region, wherein said laser exhibits two stable light intensity states, an upper intensity state corresponding to bias current that is not below an upper current threshold and a lower intensity state corresponding to bias current that is not above a lower current threshold.

25. An intersubband semiconductor laser comprising:

an active region including a multiplicity of repeat units, each repeat unit including a unipolar radiative transition (RT) region and a relaxation/injection (I/R) region adjacent thereto, said RT regions having a gain spectrum, electrodes for applying electrical pumping energy to said active region for causing unipolar carriers to undergo intersubband optical transitions within said RT regions, thereby to generate stimulated emission of radiation along a first propagation axis, upper and lower cladding regions bounding said core region, and an optical cavity resonator for providing optical feedback of said radiation to said RT regions, characterized in that said resonator includes a 2D array of essentially equally spaced regions that exhibit resonant modes at particular frequencies, each of said spaced regions has a depth that extends through said active region and transverse to said first axis, each of said spaced regions has an average refractive index different from that of said active region, thereby defining a refractive index contrast between said spaced regions and said active region, and said refractive index contrast, the dimensions of each of said spaced regions, and the spacing of said spaced regions are mutually adapted so that said array is a micro-cavity resonator having it axis along said first direction and so that at least one frequency of said modes of said 2D array falls within said gain spectrum of said active region.

26. The laser of claim 25, wherein said refractive index contrast, the dimensions of each of said spaced regions, and the spacing of said spaced are also mutually adapted so that a significant portion of said radiation is deflected out of said resonator along a second direction transverse to said first direction.

27. The laser of claim 25, wherein said spaced regions have a perturbation in a predetermined zone.

28. The laser of claim 25, wherein, the refractive index of said lower cladding region is slightly smaller than that of said active region.

29. The laser of claim 28, wherein the size of said spaced regions in said lower cladding region is not smaller than the size of said spaced regions in said active region.

30. The laser of claim 25, further including a nonlinear optical material optically coupled to said resonator.

31. The laser of claim 30, wherein said nonlinear optical material comprises a layer that overlays said resonator.

32. The transducer of claim 30, wherein each of said spaced regions comprises a nonlinear optical material.

33. The transducer of claim 32, wherein said laser exhibits two stable light intensity states, an upper intensity state corresponding to bias current that is not below an upper current threshold and a lower intensity state corresponding to bias current that is not above a lower current threshold.

* * * * *